US 6,620,301 B1

(12) United States Patent
Braeckelmann

(10) Patent No.: US 6,620,301 B1
(45) Date of Patent: Sep. 16, 2003

(54) METHOD FOR FORMING A SPUTTERED LAYER AND APPARATUS THEREFOR

(75) Inventor: Walter Gregor Braeckelmann, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/109,281

(22) Filed: Mar. 28, 2002

(51) Int. Cl.$^7$ ................................................ C23C 14/34
(52) U.S. Cl. .................... 204/192.13; 204/192.12; 204/192.17; 204/298.03; 204/298.16
(58) Field of Search ...................... 204/192.12, 192.13, 204/192.17, 298.03, 298.16

(56) References Cited

U.S. PATENT DOCUMENTS

| | | | |
|---|---|---|---|
| 5,346,600 A | | 9/1994 | Nieh et al. |
| 5,439,574 A | * | 8/1995 | Kobayashi et al. ..... 204/192.12 |
| 5,455,197 A | * | 10/1995 | Ghanbari et al. ...... 204/192.13 |
| 5,985,102 A | | 11/1999 | Leiphart |
| 6,042,706 A | | 3/2000 | Fu |
| 6,139,696 A | | 10/2000 | Arunachalam et al. |
| 6,179,973 B1 | | 1/2001 | Lai et al. |
| 6,217,716 B1 | | 4/2001 | Fai Lai |
| 6,217,718 B1 | | 4/2001 | Holmann et al. |
| 6,224,724 B1 | | 5/2001 | Licata et al. |
| 6,231,725 B1 | | 5/2001 | Nulman et al. |

FOREIGN PATENT DOCUMENTS

| | | |
|---|---|---|
| EP | 0 492 992 B1 | 2/1996 |
| WO | WO 98/37569 | 8/1998 |

OTHER PUBLICATIONS

S.M.Rossnagel, "Directional and Ionized Sputter Deposition For Microelectronics Applications", Proceedings of the 3$^{rd}$ ISSP (Tokyo, 1995), pp. 253–260.

* cited by examiner

Primary Examiner—Rodney G. McDonald
(74) Attorney, Agent, or Firm—Patricia S. Goddard; Kim-Marie Vo

(57) ABSTRACT

Uniformity of a sputtered conductive barrier layer (50) or seed layer (52) across a semiconductor substrate (18, 42) is improved by incorporating a plurality of electromagnets (26) in or around the sputtering chamber (14) which can be independently powered. In other words, each individual electromagnet can be turned on or off, and/or the amount of power being supplied to each electromagnet (and thus the magnetic field generated by each electromagnet) can be varied independently. Further, the sputtering system (10) includes connection to a computer (30) that is either integral to or connected to a metrology tool (28). The metrology tool measures uniformity of a layer deposited by the sputtering system, analyzes the measurements and feeds back information to the sputtering system as to how to vary the power being supplied to the plurality of electromagnets to improve layer uniformity.

20 Claims, 2 Drawing Sheets

METHOD FOR FORMING A SPUTTERED LAYER AND APPARATUS THEREFOR

FIELD OF THE INVENTION

The field of the invention relates generally to semiconductor devices, and more specifically, to sputtering films on semiconductor devices.

RELATED ART

In forming semiconductor devices, thin films (10–3000 Angstroms) are often deposited using physical vapor deposition (PVD) or sputtering in a sputtering chamber. Traditional sputtering uses an argon atom ionized by a high power (approximately 500 W–10,000 W) and a low pressure (approximately 0.5–30 mTorr) to bombard a target. Released by the bombardment of the target with argon, a neutral target atom travels to a semiconductor wafer and forms the thin film in conjunction with other atoms from the target and/or other gases that may be present in the sputtering chamber. As device dimensions (particularly the width of vias,) shrink, the ability to sputter neutral atoms into narrow vias using traditional sputtering is difficult because more of the neutral atoms deposit at the top of the vias than at the sidewalls and bottom and thus the opening of the vias can close without suitable deposition within the via. Even if the opening isn't closed, the uniformity of the thin film in the vias is poor.

By ionizing the atoms released from the target as done in ionized PVD (iPVD), another type of sputtering, thin film deposition within narrow vias is improved by the ability to control the path of the ionized atoms released from the target by electric and magnetic fields. Thus, controlling where the atoms deposit on the semiconductor wafer. One approach uses two circular electromagnetic rings outside the sputtering chamber, one above and one below wafer level, to control electric and magnetic fields and, hence, the path of the released atoms from the target to the semiconductor wafer. Due to the presence of features in the sputtering chamber, such as gas inlets, a pumping port, and a slit valve, the two circular magnetic rings do not produce uniform electric fields within the chamber. Hence, while uniformity on a local scale (e.g. within vias) is improved, uniformity of the thin film across the semiconductor wafer is poor, which results in yield loss and increases manufacturing costs. Therefore, a need exits to improve uniformity of the thin film across the semiconductor wafer.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Uniformity of a sputtered layer on a semiconductor wafer is improved by incorporating a plurality of electromagnets, which can be independently powered, in or around the sputtering chamber. In other words, each individual electromagnet can be turned on or off, and/or the amount of power being supplied to each electromagnet (and thus the magnitude and polarity of the magnetic field generated by each electromagnet) can be varied independently. In a preferred embodiment, the electromagnets are located on at least the side of the sputtering chamber that is closest to one side (i.e. the top or bottom) of the semiconductor wafer. In one embodiment, the electromagnets are located on at least the side of the sputtering chamber that is under the semiconductor wafer and not between the semiconductor wafer and a sputtering target.

Further, in one embodiment, the sputtering system (10) includes connection to a computer (30) that is either integral to or connected to the sputtering chamber and a metrology tool (28). The computer measures uniformity of a layer deposited by the sputtering system, analyzes the measurements and feeds back information to the sputtering system as to how to vary the power being supplied to the plurality of electromagnets to improve layer uniformity. The invention is defined by the claims and better understood by turning to the figures.

Figure 1:
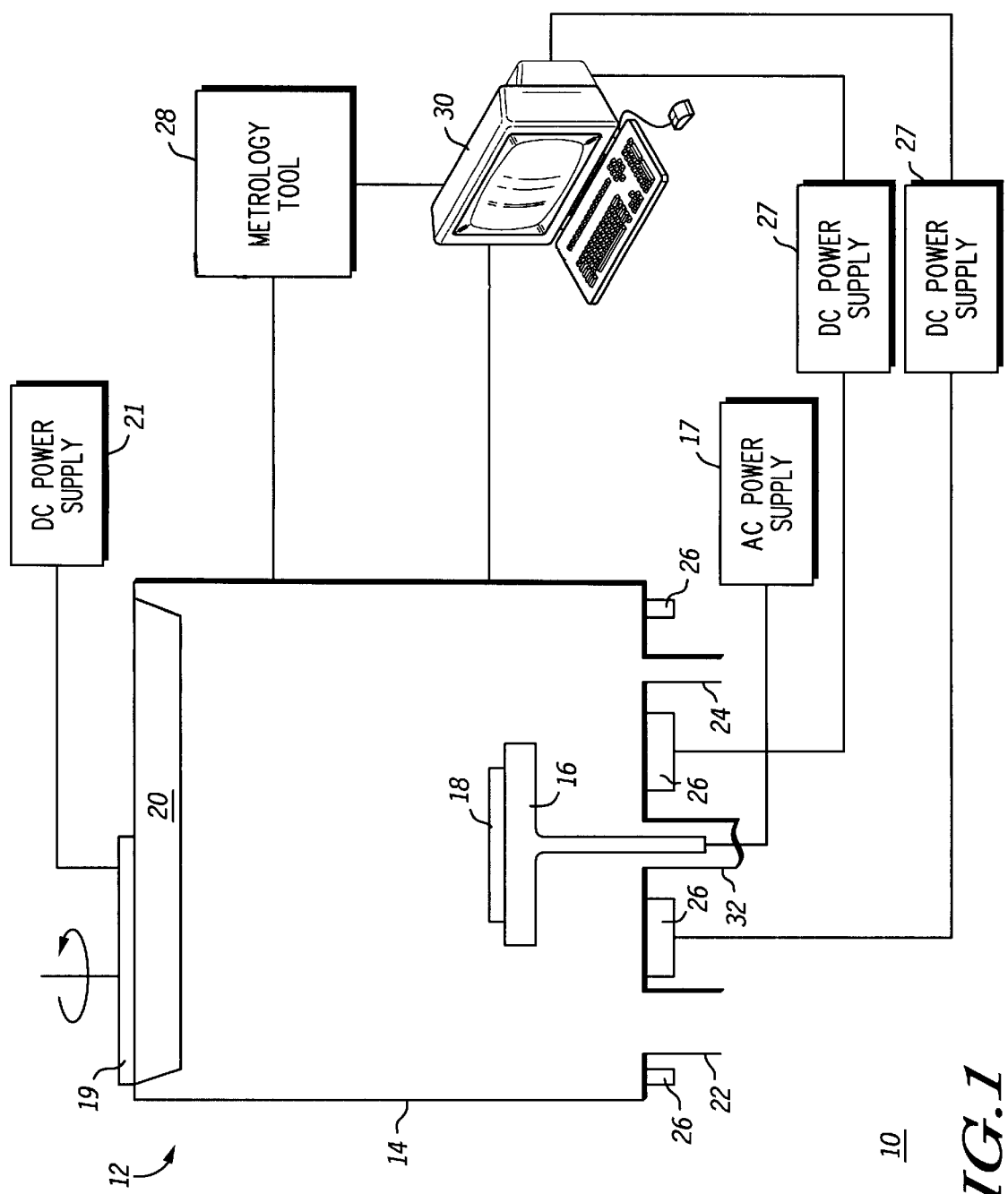
FIG. 1 illustrates a control system including an ionizing physical vapor depositing system (iPVD), a metrology tool, a computer, and power supplies in accordance with one embodiment of the present invention.

FIG. 1 illustrates a control system 10 including an ionizing physical vapor deposition (iPVD) system (sputtering system) 12 connected to power supplies 21 and 17, a metrology tool 28 and a computer 30. The iPVD system 12 includes a semiconductor wafer 18 positioned on a wafer chuck 16 located near one side (e.g. the bottom) of a sputtering chamber 14 and a sputtering target 20 located near another side (e.g. the top) of the sputtering chamber 14. The sputtering chamber 14 may be made of a non-magnetic material, (such as non-magnetic stainless steel), or aluminum or titanium, and has a pumping port 22 that is used to pump the atmosphere in the sputtering chamber 14 to vacuum.

The sputtering chamber 14 also has a gas inlet 24, which supplies gas used for sputtering, and a chuck feed through 32, which accommodates a stem for the wafer chuck 16 and any other equipment for the wafer chuck 16 (e.g., a thermocouple, and a power supply for wafer biasing and/or an electrostatic chuck). The wafer chuck 16 supports the semiconductor wafer 18 within the sputtering chamber 14. The semiconductor wafer 18 can be silicon, silicon germanium, gallium arsenide, silicon-on-insulator (SOI), or any other III–V material and can be at any processing stage in a semiconductor processing flow, such as a CMOS (complementary metal oxide semiconductor) process flow. In one embodiment, the semiconductor wafer 18 is processed to a point in which it has a step or opening exposed on the surface and the control system 10 is used to deposit a thin film over the step or into the opening. Therefore, in one embodiment, the top most surface of the semiconductor wafer 18 may have a via opening formed within a dielectric layer and a conformal barrier layer may be deposited in the via opening using the control system 10.

In one embodiment, the semiconductor wafer 18 is directly opposite and parallel to the sputtering target 20. In another embodiment, the sputtering target 20 is on a sidewall of the sputtering chamber 14 and is angled towards the semiconductor wafer 18. In yet another embodiment, more than one sputtering target is used and the sputtering targets can be in any configuration (e.g. directly opposite and parallel to the semiconductor wafer 18 and/or on the sidewall of the sputtering chamber 14). The sputtering target 20 includes one to all components of the material to be sputtered onto the semiconductor wafer 18. (If more than one sputtering target 20 is present in the sputtering chamber 14, the material to be deposited may be a combination of the materials on the targets.) In one embodiment, the resulting sputtered layer contains a metal, such as tantalum, titanium, tungsten, tantalum nitride, titanium nitride, tungsten nitride, silicon nitrides, copper and aluminum. Any other suitable material that can be ionized can be used.

An optional sputtering target magnet 19 lies outside the sputtering chamber 14 and over the sputtering target, controlling the releasing of the material of the sputtering target 20 by spinning and rotating, as known in the art. Therefore, the optional sputtering target magnet 19 prevents one section of the sputtering target 20 from eroding substantially faster than another section. To sputter the material from the sputtering target 20 to the semiconductor wafer 18, in one embodiment a semiconductor wafer 18 is placed into a load lock in which the pressure is pumped down to vacuum. In this embodiment, once vacuum is reached the semiconductor wafer 18 is transferred (in one embodiment, by a robotic arm) into the sputtering chamber 14, which has previously been pumped down to vacuum using the pumping port 22. Typically, the semiconductor wafer 18 has a notch or indentation at one point on the perimeter of the semiconductor wafer 18 which can be used as a reference point. For example, the notch can always be placed in a specific position (i.e. at the midpoint of the door on the sputtering chamber 14). Thus by using the notch as a reference point, the location of each part of the semiconductor wafer 18 after sputtering can be matched with a specific area of the sputtering chamber 14. The usefulness of this matching will become apparent below.

Power is applied to the sputtering target by a first power supply 21, which in one embodiment is a DC power supply. A voltage differential exists between the sputtering target that is negatively charged (cathode) and the remainder of the chamber. Additionally, bias power can be applied to the wafer chuck 16. The wafer chuck 16 is coupled to the second power supply 17 and sputtering target is coupled to the first power supply 21. In one embodiment, the power applied to the target is on the order of a approximately 5–60 kilo Watt, the power supply 17 is an AC power supply and/or the first power supply 21 is a DC power supply.

In the sputtering chamber 14, a non-reactive gas, such as argon, helium, or xenon is introduced into the sputtering chamber 14 via the gas inlet 24. A first neutral argon atom is ionized (in one embodiment, by a cosmic ray) giving off a first electron. Due to the voltage differential, the first electron impacts a second neutral argon atom creating second electron and second ionized argon atom. This process is repeated so that a plasma including electrons, ionized argon atoms, and neutral argon atoms exists within the sputtering chamber 14.

The ionized argon atoms, which are positively charged, are attracted and therefore accelerated towards the sputtering target 20 (negatively charged). The magnitude of the voltage differential in the sputtering chamber controls the force with which the argon atom is attracted to the sputtering target 20. Upon impact with the sputtering target 20, the ionized argon's energy dislodges and ejects an atom from the sputtering target 20. (Some energy from the ionized argon may be transferred to the sputtering target 20 in the form of heat.) The dislodged atom becomes ionized like the neutral argon atoms, by impacting the electrons in the plasma. Once ionized, the released atom follows magnetic field paths to the semiconductor wafer 18 to form a sputtered layer with other identical, similar or different atoms and/or materials already on the semiconductor wafer 18.

The magnetic field present in the sputtering chamber 14 is controlled by electromagnets 26 that lie about the sputtering chamber 14. In one embodiment, the electromagnets 26 are inside the sputtering chamber 14. In this embodiment, the surfaces of the electromagnets 26 need to be treated as to be clean enough to be able to be placed in the vacuum environment.

In a preferred embodiment, the electromagnets 26 lie outside the sputtering chamber 14, because of the ease of manufacturing and maintenance of the system. For example, feed throughs, which would electrically couple the electromagnets 26 from inside the sputtering chamber 14 to the DC power supply 27 outside the chamber may be fragile and expensive. In one embodiment, the electromagnets 26 are each individually coupled to the DC power supply 27, which allow for the power and polarity of each of the electromagnets 26 to be adjusted, as will be explained in more detail below. In another embodiment, a group of the electromagnets 26 are coupled to the DC power supply 27 and there are more than one group of electromagnets 26 about the sputtering chamber 14. That is, the electromagnets 26 may be grouped so that each DC power supply 27 controls one group of the electromagnets 26. (Any number of electromagnets (i.e. one or more) can be in the group of the electromagnets. Additionally, any number of groups (i.e. one or more) can be present.)

Also in the preferred embodiment, the electromagnets 26 are located on the bottom of the sputtering chamber 14 because controlling uniformity of the sputtered layer across the semiconductor wafer 18 is believed to be superior to other configurations of the electromagnets 26 about the chamber. Alternatively, the electromagnets 26 can lie anywhere about the sputtering chamber 14, such as on sidewalls or on the sidewalls and the bottom.

After forming the sputtered layer, the semiconductor wafer 18 is transferred by a robot or person to a metrology tool 28, which in one embodiment includes a computer, where the uniformity of the sputtered layer across the semiconductor wafer 18 is measured. (In one embodiment, the notch of the semiconductor wafer 18 can be used for alignment in order to correspond the measured area with a location within the sputtering chamber 14.) The uniformity of the sputtered layer across the semiconductor wafer 18 is determined by measuring and recording sheet resistance ($R_s$) or the thickness of the sputtered layer. In one embodiment, at least two different locations of the sputtered layer are measured and recorded. Preferably, more than two locations are measured on the wafer in a predetermined pattern. For example, the $R_s$ of the sputtered layer can be determined by measuring points along concentric circles using a four point probe, resulting in a contour map. The thickness of the sputtered layer can be measured using X-Ray fluorescence (XRF) or an opto-acoustic method (e.g. picosecond ultrasonic laser sonar). The uniformity measurements are transferred to a computer 30, where they are compared to each other, a reference, a range of predetermined reference points, a mean of all the uniformity measurements, or the like using software. In one embodiment, the reference can be a mean of uniformity measurements over many semiconductor wafers. If one of the uniformity measurements is unsatisfactory, (e.g., the uniformity measurement is not within the range of predetermined reference points), the computer 30 selectively and variably adjusts at least one of the electromagnets 26. In one embodiment, the computer 30 controls and alters the power of selected electromagnets 26 using software. In one embodiment, the polarity of an electromagnet 26 is changed by adjusting the power to a negative value. In another embodiment, the computer 30 controls the locations of the electromagnets by instructing a motor coupled to the iPVD system 12 to move the electromagnets to a new predetermined location. (In another embodiment, the location of the magnets can be altered manually based upon the uniformity measurements.) In one embodiment, the same computer is used to control the power supplied to the electromagnet and determine a set of power conditions.

The uniformity measurement can be undesirable if too few atoms were deposited in an area (the thickness of the area is too thin) or too many atoms were deposited in an area (the thickness of the area is too thick). For example, in one embodiment the sputtering target magnet 19 at the top of the sputtering chamber 14 is set so that the north pole of the magnet is pointing up and the south pole is pointing towards the wafer. If the uniformity measurement at a first area results in too few atoms being deposited (i.e. the sputtered layer at this location is too thin), the electromagnets 26 that correspond to the first area on the wafer are adjusted so that the magnetic pole facing the wafer 18 has a stronger north signal. This can be accomplished by changing the magnetic polarity of the electromagnet 26 from south to north, or, if the electromagnet's magnetic polarity is already set to north, the power can be increased. Since magnetic fields flow from north to south, the electromagnet 26 that was adjusted will have a stronger magnetic field flowing from the side of the electromagnet 26 that is closest to the sputtering chamber 14 (north) to the side of the magnet that is farthest away from the sputtering chamber 14 (south). Therefore, the magnetic field of the electromagnet 26 will pull the magnetic fields from the sputtering target magnet 19 closer together, thereby forcing more atoms from the sputtering target 20 to travel towards the electromagnet 26 that was adjusted. Hence, the number of atoms being deposited onto the semiconductor wafer 18 in the area above the electromagnet 26 that was adjusted will increase, creating a thicker layer at the first area compared to the process prior to adjustment.

The electromagnets 26 can be adjusted and varied individually or in groups. As described above in one embodiment, differing amounts of power are applied to each electromagnet 26. It is possible that during sputtering no power is applied to at least one electromagnet 26. More specifically, in one embodiment, no power is applied to at least one of the electromagnets 26 during sputtering prior to measuring thickness uniformity and in another embodiment, no power is applied during sputtering after measuring thickness uniformity. In other words, after measuring thickness uniformity power applied to an electromagnet or group of electromagnets is shut off and power is turned on for a different electromagnet or group of electromagnets.

In one embodiment, after the uniformity results are determined and a new set of power conditions (and possibly locations) are determined, the electromagnets 26 can be altered for sputtering a layer on either the same or another semiconductor wafer based upon the information fedback to the sputtering chamber 14 by the computer 30. Using the uniformity results from a semiconductor (test or product) wafer i to alter the power conditions (and possibly locations) of electromagnets 26 for a different semiconductor wafer is likely if the metrology tool 28 is separate from the iPVD system 12, because in situ monitoring of the iPVD process will not be performed in this embodiment. Thus, a test wafer may be used to determine settings (e.g. power conditions, location, etc.) for the electromagnets 26.

However, adjusting the power conditions and location of the electromagnets based on results from a test wafer or another semiconductor (product) wafer may also be used if the metrology tool 28 is integrated with the iPVD system 12. In this embodiment where the metrology tool 28 is incorporated into the iPVD system 12, the power conditions alternatively may be altered using the electromagnets 26 during deposition (i.e. in situ). This embodiment is preferred because one semiconductor wafer doesn't have to be processed and then either reprocessed or scraped. Thus, cycle time and manufacturing cost is less than other embodiments.

Alternatively, the same semiconductor wafer can be replaced into the iPVD system 12 after measurement of uniformity and additional sputtering can occur if portions of the layer are too thin and the portions that aren't too thin can be thicker or will be subsequently removed during future processing (i.e. the thickness in the areas which are not too thin is irrelevant to functionality of a semiconductor device.) This can occur if the metrology tool 28 is integrated or distinct from the iPVD system 12.

Figure 2:
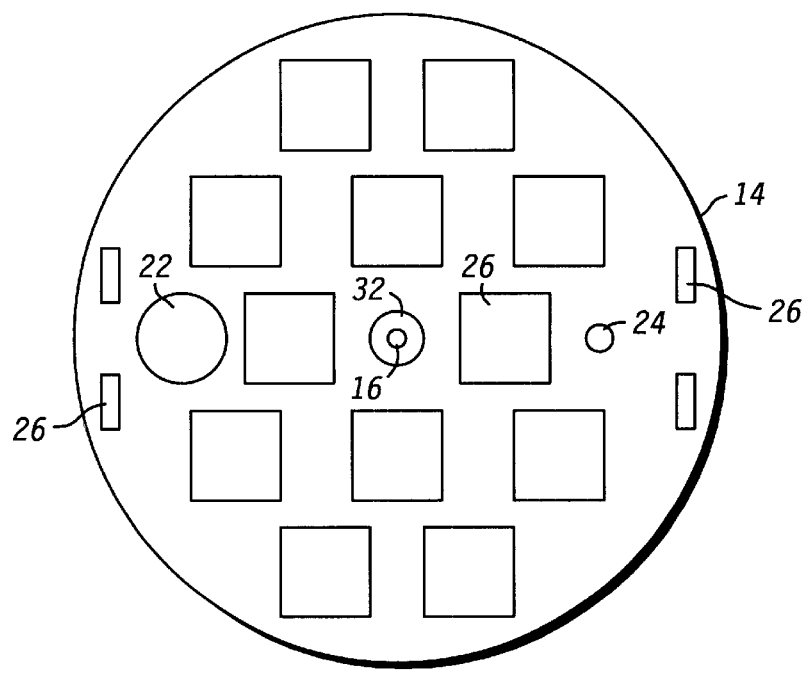
FIG. 2 illustrates a bottom view of the sputtering chamber of the iPVD system of FIG. 1.

The electromagnets 26 in the cross-sectional view of the iPVD system 12 shown in FIG. 1 are, in one embodiment, underneath the semiconductor wafer 18, and outside the stem of the wafer chuck 16. A bottom view of the sputtering chamber 14 is shown in FIG. 2. The area not covered by the pumping port 22, the chuck feed through 32, the wafer chuck. 16, and the gas inlet 24 are the electromagnet available area. The electromagnet available area can have electromagnets 26 located thereon. However, it is not necessary for all the electromagnet available area to have electromagnets 26 and no particular shape is required. As shown in FIG. 2 the electromagnets 26 can vary in size. Additionally, the electromagnets 26 can form any pattern or be in a random layout, but preferably size/location is selected so as to maximize the uniformity of deposition. Any number of the electromagnets 26 can be located under the wafer or on the bottom of the sputtering chamber 14.

Figure 3:
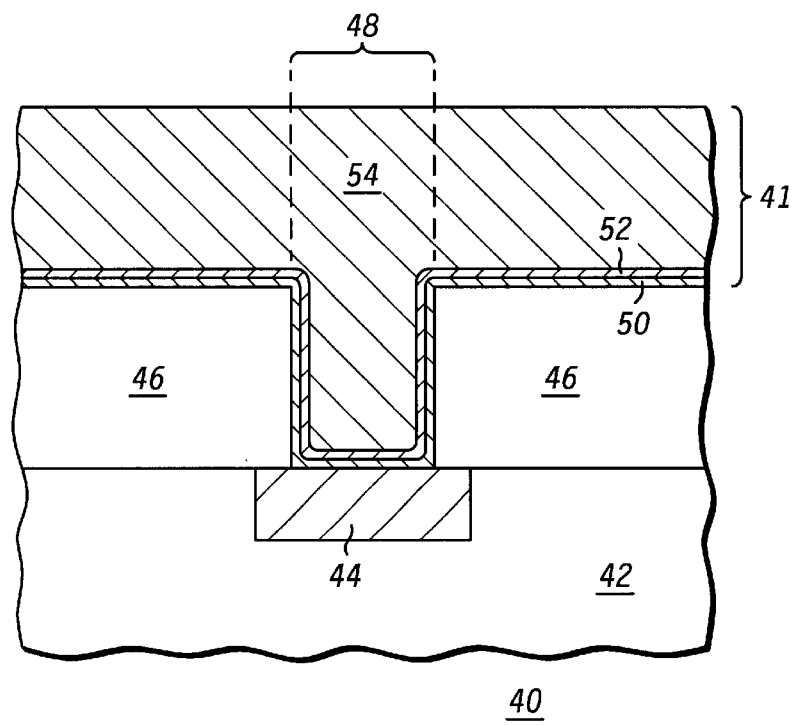
FIG. 3. illustrates a cross-section of a portion of a semiconductor device formed using the control system of FIG. 1.

FIG. 3 illustrates a portion of a semiconductor device 40 that has an inlaid interconnect metallization structure having thin film layers (about 10–3000 Angstroms) that can be formed by the control system 10. The semiconductor device 40 includes a portion of a conductive stack 41 formed within a via or opening 48 and coupled to a conductive member 44 within a portion of a semiconductor substrate 42. An interlayer dielectric (ILD) layer 46 electrically isolates the conductive stack 41 formed within the via 48 from other conductive materials located on portions of the semiconductor substrate 42 that are not shown. The ILD layer 46 can be any dielectric material such as silicon dioxide formed from tetraethylorthosilane (TEOS), silicon dioxide formed from fluorinated TEOS (F-TEOS), a dielectric material with a low dielectric constant, the like and combinations of the above. The conductive stack includes a barrier layer 50, a seed layer 52 formed over the barrier layer 50, and a bulk interconnect metal formed over the seed layer 52.

In one embodiment, the barrier layer 50 and the seed layer 52 are formed using the control system 10. The barrier layer 50 can include any refractory metal, such as titanium or tantalum, and their nitrides and silicon nitrides, such as titanium nitride (TiN), titanium nitride silicon (TiNSi) and tantalum nitride (TaN) and any self-aligned barrier such as $MgO_x$ or $AlO_x$. In one embodiment, the barrier layer is an adhesion layer used to alleviate adhesion problems between an overlying bulk interconnect metal 54, which in one embodiment is copper, and the ILD layer 46. The barrier layer 50 may prevent diffusion between the bulk interconnect metal 54 and the ILD layer 46. In one embodiment the barrier layer 50 is approximately 10–400 Angstroms of Ta. The seed layer 52 can be any conductive material, such as copper or copper alloys (i.e. copper tin, copper silver, copper zirconium, copper carbon, copper calcium, copper indium, copper boron, copper magnesium, or copper aluminum), and in one embodiment is approximately 40–2000 Angstroms of copper. The seed layer 52 provides for a surface suitable for formation of the bulk interconnect metal 54. The bulk interconnect metal 54 is preferably copper and can be deposited by PVD, chemical vapor deposition (CVD), electroplated, the like, or combinations of the above and, in a preferred embodiment, is approximately 1000–8000 Angstroms of copper. The seed layer 52 and the bulk interconnect metal 54 transmit an electrical signal from a conductive member 44, which can be copper or any other conductive material, to other metal layers, active devices, or outside the semiconductor device.

The ability to selectively and variably control individual electromagnets 26 based upon uniformity measurements increases the uniformity of the sputtered layer on the semiconductor wafer. Since deposition across the semiconductor wafer is not necessarily uniform due to the sputtering tool configuration and the process parameters chosen, the method described above allows for individual control of different areas of the semiconductor wafer in order to improve uniformity. Additionally, the uniformity of the sputtered material within an opening, such as a via or trench, is improved since the ability to control the location of the atom released from the sputter target 20 is increased. A more conformal deposition of material, especially thin films, within an opening is described above which can be used as the opening decreases as semiconductor device features shrink. Thus, the, problem of the opening closing off and/or not enough material being deposited on the sidewalls and corners of a via, for example, is alleviated. Asymmetry of the deposited thickness along the via or trench sidewall at the wafer edge is especially improved. The described method therefore not only improves across wafer uniformity, but the profile of the deposited material within the features is more uniform when comparing devices in the center of the wafer to devices along an edge of the wafer.

Another advantage of the described method is that a process parameter is added to the system that directly influences uniformity. Commonly, process development has to improve a number of parameters (e.g. step coverage, uniformity, resistivity, stress, grain size, etc.) using a given set of variables (process pressure, temperature, target to substrate spacing, gas flow, etc.). Using the above described method uniformity can be controlled directly and the variables can be chosen to improve other parameters affecting sputtering.

Also, using the described method, not only can the film be deposited more uniformly, but the thickness can be controlled to achieve any profile desirable by subsequent processes. For example, it could be desirable to have a process where the layer at the center of the wafer is intentionally thicker than any other area of the wafer, if the subsequent processing accommodates for this (e.g. if the subsequent process removes the material at the center of the wafer faster than anywhere else).

Another advantage is that by automating control of the:sputtering process as described above, process capability is improved and manufacturing costs are reduced by reducing the amount o of operator handling and intervention. Thus, the potential for operator error and, therefore, yield loss is greatly reduced.

Although the calculation and comparison of the uniformity measurements as described was performed by the computer 30, either or both functions can be performed by the metrology tool 28 and/or the iPVD system 12 if either include computation capability. Additionally, the transmission and altering of the power for the electromagnets 26 can be performed by the metrology tool 28 and/or the iPVD system 12. In one embodiment, the computer 30 is incorporated into the metrology tool 28 and, in another embodiment, into the iPVD system 12. In yet another embodiment, some functions of the computer 30 can be performed by the metrology tool 28 and others by the iPVD system 12.

Although the electromagnets 26 are shown as rectangles is in FIGS. 1 and 2, they can be any shape (e.g. circular, rectangular, hexagonal, etc.) and can be formed in any pattern along any interior and/or exterior wall of the sputtering chamber. In another embodiment, the electromagnets 26 can,be formed underneath the wafer chuck 16.

By know a skilled artisan should appreciate that the present-invention is not limited to the sputtering tool illustrated. Any ionized sputtering system can be used. Additionally, the DC power supply 27 can be any type of power supply. Titanium, tantalum and copper have been some of the materials that have been described to be deposited using the present invention, however, any material that can be deposited using an ionized sputtering system can be formed using the present invention.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of depositing a layer of material on a first semiconductor substrate comprising:

providing a sputtering system having a sputtering chamber, a sputtering target, a wafer chuck, and a plurality of electromagnets disposed about the sputtering chamber and below the wafer chuck, wherein power to each electromagnet of the plurality of electromagnets is individually controllable;

placing the first semiconductor substrate on the wafer chuck and within the sputtering chamber;

sputtering a target material from the sputtering target onto a surface of the first semiconductor substrate to form the layer of material; and applying power to the plurality of electromagnets during sputtering, wherein applying power comprises applying a first set of power conditions to the plurality of electromagnets, wherein differing amounts of power are applied to each electromagnet of the plurality of electromagnets;

removing the first semiconductor substrate from the sputtering chamber;

placing a second semiconductor substrate on the wafer chuck and within the sputtering chamber;

sputtering the target material on a surface of the second semiconductor substrate; and applying power to the plurality of electromagnets using a second set of power conditions, wherein the second set of power conditions is different from the first set of power conditions and the second set of power conditions is determined by measuring a uniformity in thickness of the layer of material formed on the first semiconductor substrate.

2. The method of claim 1 wherein the first set of power conditions included having no power applied to at least one of the electromagnets of the plurality of electromagnets.

3. The method of claim 1 wherein the layer of material is selected from a group of metal containing materials consisting of copper, titanium, tantalum, titanium nitride, titanium nitride silicon, and tantalum nitride.

4. The method of claim 1 wherein the layer of material is a conductive material which forms part of an inlaid interconnect metallization structure.

5. The method of claim 4 wherein the layer of material is either a seed layer or a barrier layer.

6. The method of claim 1 wherein the plurality of electromagnets are provided external to the sputtering chamber.

7. The method of claim 1 further comprising:

measuring thickness uniformity of the layer of material to produce uniformity results;

supplying the thickness uniformity results to a computer; and using the computer to analyze the thickness uniformity results and to calculate a second set of power conditions to improve the thickness uniformity results.

8. The method of claim 7 further comprising:

using the computer to feed back information of the second set of power conditions to the sputtering system; and sputtering target atoms onto a surface of another semiconductor substrate while applying power to the plurality of electromagnets using a second set of power conditions different from the first set of power conditions.

9. The method of claim 8 wherein applying power to the plurality of electromagnets using the second set of power conditions comprises applying different amounts of power to different electromagnets within the plurality of electromagnets.

10. A method for depositing a layer of material onto a semiconductor substrate comprising:

providing a sputtering system, the sputtering system having sputtering chamber, a wafer chuck having the semiconductor substrate positioned thereon, a sputtering target above the semiconductor substrate, and a plurality of electromagnets disposed about the sputtering chamber and below the semiconductor substrate, wherein power being supplied to each electromagnet can be independently controlled; and sputtering material from the sputtering target to form the layer of material on the semiconductor substrate, wherein sputtering is performed while applying power variably and selectively to the plurality of electromagnets.

11. The method of claim 10 wherein providing a sputtering system comprises providing an ionized plasma vapor deposition (iPVD) system.

12. The method of claim 10 wherein applying power comprises applying power to some but not all of the plurality of electromagnets.

13. The method of claim 10 wherein applying power comprises applying varying amounts of power to individual electromagnets during sputtering.

14. The method of claim 10 wherein applying power comprises applying a constant power to each electromagnet during sputtering but wherein the constant power being applied to each electromagnet varies among the plurality of electromagnets.

15. The method of claim 10 wherein applying power comprises applying power to the plurality of electromagnets under first power conditions, and further comprising:

providing a metrology tool;

using the metrology tool to determine measurement results for thickness of the layer of material across the semiconductor substrate;

processing the measurement results to determine second power conditions needed to improve thickness uniformity of the layer of material across the semiconductor substrate;

feeding back the second power conditions to the sputtering system; and sputtering another layer of material onto another semiconductor substrate while applying power to the plurality of electromagnets under the second power conditions.

16. The method of claim 15 wherein processing and feeding back are done by a computer.

17. A sputtering system with increased deposition uniformity comprising:

a sputtering chamber for receiving a substrate;

a plurality of electromagnets disposed about the sputtering chamber, a metrology tool for measuring thickness and uniformity of thickness of a deposited layer across the substrate;

means for independently controlling power supplied to each electromagnet of the plurality of electromagnets;

means, coupled to the metrology tool, for determining a set of power conditions to be supplied to the plurality of electromagnets based on thickness and uniformity measurements of the deposited layer; and means for providing the set of power conditions to the sputtering system; wherein the means for independently controlling power supplied to each electromagnet acts in response to information of the power conditions supplied to each electromagnet of the plurality of electromagnets.

18. The sputtering system of claim 17 wherein the means for independently controlling power supplied to each electromagnet of the plurality of electromagnets, the means for determining a set of power conditions, and the means for providing the set of power conditions are computer means.

19. The sputtering system of claim 18 wherein a computer is used to independently control power supplied to each electromagnet of the plurality of electromagnets, to determine the set of power conditions and to provide the set of power conditions.

20. The sputtering system of claim 17 wherein the plurality of electromagnets are positioned below a substrate receiving chuck of the sputtering system.

* * * * *